US011289802B2

(12) United States Patent
Paulotto et al.

(10) Patent No.: US 11,289,802 B2
(45) Date of Patent: Mar. 29, 2022

(54) MILLIMETER WAVE IMPEDANCE MATCHING STRUCTURES

(71) Applicant: Apple Inc., Cupertino, CA (US)

(72) Inventors: Simone Paulotto, Redwood City, CA (US); Jennifer M. Edwards, San Francisco, CA (US); Harish Rajagopalan, San Jose, CA (US); Bilgehan Avser, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 259 days.

(21) Appl. No.: 16/413,508

(22) Filed: May 15, 2019

(65) Prior Publication Data

US 2020/0321690 A1 Oct. 8, 2020

Related U.S. Application Data

(60) Provisional application No. 62/831,110, filed on Apr. 8, 2019.

(51) Int. Cl.
*H01Q 1/22* (2006.01)
*H01Q 1/38* (2006.01)
(Continued)

(52) U.S. Cl.
CPC ............. *H01Q 1/38* (2013.01); *H01P 5/085* (2013.01); *H01Q 1/22* (2013.01); *H01R 13/6473* (2013.01); *H05K 1/0243* (2013.01); *H05K 1/0251* (2013.01); *H05K 1/113* (2013.01); *H05K 2201/09227* (2013.01);
(Continued)

(58) Field of Classification Search
CPC ........................... H01Q 1/22–48; H01P 5/085
See application file for complete search history.

(56) References Cited

U.S. PATENT DOCUMENTS

| 4,924,236 A * | 5/1990 | Schuss ................ H01Q 9/0442 343/700 MS |
| 6,346,913 B1 * | 2/2002 | Chang ................ H01Q 9/0407 343/700 MS |

(Continued)

FOREIGN PATENT DOCUMENTS

WO 2016112839 A1 7/2016

*Primary Examiner* — Hasan Islam
(74) *Attorney, Agent, or Firm* — Treyz Law Group, P.C.; Michael H. Lyons; Tianyi He

(57) ABSTRACT

An electronic device may be provided with a transceiver, a substrate, and antennas mounted to the substrate. The transceiver and antennas may convey signals between 10 GHz and 300 GHz. A radio-frequency connector may be mounted to the substrate. A coaxial cable may couple the transceiver to the connector. A stripline in the substrate may couple the connector to the antennas. Impedance matching structures may be embedded in the substrate for matching an impedance of the stripline to an impedance of the coaxial cable. The impedance matching structures may include a fence of conductive vias, landing pads, and a volume of the dielectric substrate defined by the fence of conductive vias and the landing pads. The impedance matching structures may be configured to perform impedance matching over a relatively wide bandwidth that includes the frequency band of operation for the antennas.

19 Claims, 11 Drawing Sheets

(51) Int. Cl.
*H05K 1/02* (2006.01)
*H01P 5/08* (2006.01)
*H05K 1/11* (2006.01)
*H01R 13/6473* (2011.01)

(52) U.S. Cl.
CPC .............. *H05K 2201/09609* (2013.01); *H05K 2201/09809* (2013.01); *H05K 2201/10189* (2013.01)

(56) References Cited

U.S. PATENT DOCUMENTS

| | | | |
|---|---|---|---|
| 6,794,961 B2 * | 9/2004 | Nagaishi | H01L 23/552 257/E23.114 |
| 8,170,498 B2 | 5/2012 | Rofougaran | |
| 8,299,971 B2 | 10/2012 | Talty et al. | |
| 8,350,771 B1 * | 1/2013 | Zaghloul | H01Q 5/40 343/769 |
| 8,519,891 B2 * | 8/2013 | Chen | H01Q 21/0075 343/700 MS |
| 9,306,291 B2 | 4/2016 | Lu et al. | |
| 9,509,032 B2 | 11/2016 | Wilkins et al. | |
| 9,711,863 B2 | 7/2017 | DeLuis et al. | |
| 9,748,663 B2 | 8/2017 | Wong | |
| 9,865,935 B2 | 1/2018 | Miraftab et al. | |
| 10,305,182 B1 | 5/2019 | Iellici | |
| 2012/0169547 A1 | 7/2012 | Oh et al. | |
| 2015/0015453 A1 * | 1/2015 | Puzella | H05K 1/0206 343/853 |
| 2019/0115643 A1 * | 4/2019 | Khan | H01Q 9/0485 |
| 2020/0321690 A1 * | 10/2020 | Paulotto | H05K 1/0251 |

* cited by examiner

MILLIMETER WAVE IMPEDANCE MATCHING STRUCTURES

This application claims the benefit of provisional patent application No. 62/831,110, filed Apr. 8, 2019, which is hereby incorporated by reference herein in its entirety.

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications. Radio-frequency transmission line paths are coupled between the wireless transceivers and the antennas.

It may be desirable to support wireless communications in millimeter wave and centimeter wave communications bands. Millimeter wave communications, which are sometimes referred to as extremely high frequency (EHF) communications, and centimeter wave communications involve communications at frequencies of about 10-300 GHz. Operation at these frequencies may support high bandwidths but may raise significant challenges. For example, millimeter wave communications signals generated by the antennas can be characterized by substantial attenuation and/or distortion during signal propagation. In addition, impedance discontinuities on the radio-frequency transmission line paths can produce substantial signal reflection at these frequencies, limiting the overall efficiency of the wireless communications circuitry.

It would therefore be desirable to be able to provide electronic devices with improved wireless communications circuitry such as communications circuitry that supports millimeter and centimeter wave communications.

SUMMARY

An electronic device may be provided with wireless circuitry. The wireless circuitry may include radio-frequency transceiver circuitry and an antenna module. The antenna module may include a dielectric substrate and one or more antennas on the dielectric substrate. The radio-frequency transceiver circuitry and the antennas may convey radio-frequency signals between 10 GHz and 300 GHz.

A radio-frequency connector may be mounted to a surface of the dielectric substrate. A first radio-frequency transmission line such as a coaxial cable may couple the radio-frequency transceiver circuitry to the radio-frequency connector. A second radio-frequency transmission line such as a stripline may be embedded in the dielectric substrate. The stripline may couple the radio-frequency connector to at least one of the antennas.

Impedance matching structures may be embedded within the dielectric substrate and may be coupled between the stripline and the radio-frequency connector. A conductive via may couple a signal conductor of the stripline to a signal body portion of the radio-frequency connector. Landing pads may be interposed on the conductive via between the signal body portion of the radio-frequency connector and the signal conductor of the stripline. A ring-shaped fence of conductive vias may couple ground traces in the stripline to a grounded body portion of the radio-frequency connector. The fence of conductive vias may laterally surround the conductive via and the landing pads. The impedance matching structures may include the fence of conductive vias, the landing pads, and a volume of the dielectric substrate defined by the landing pads and the conductive vias. The width of the landing pads, the diameter of the fence of conductive vias, and the dielectric constant of the dielectric substrate within the volume may be selected to match an impedance of the stripline to an impedance of the coaxial cable. The impedance matching structures may perform impedance matching in this way over a relatively large bandwidth that includes the frequency band of operation for the antenna module.

DETAILED DESCRIPTION

Figure 1:
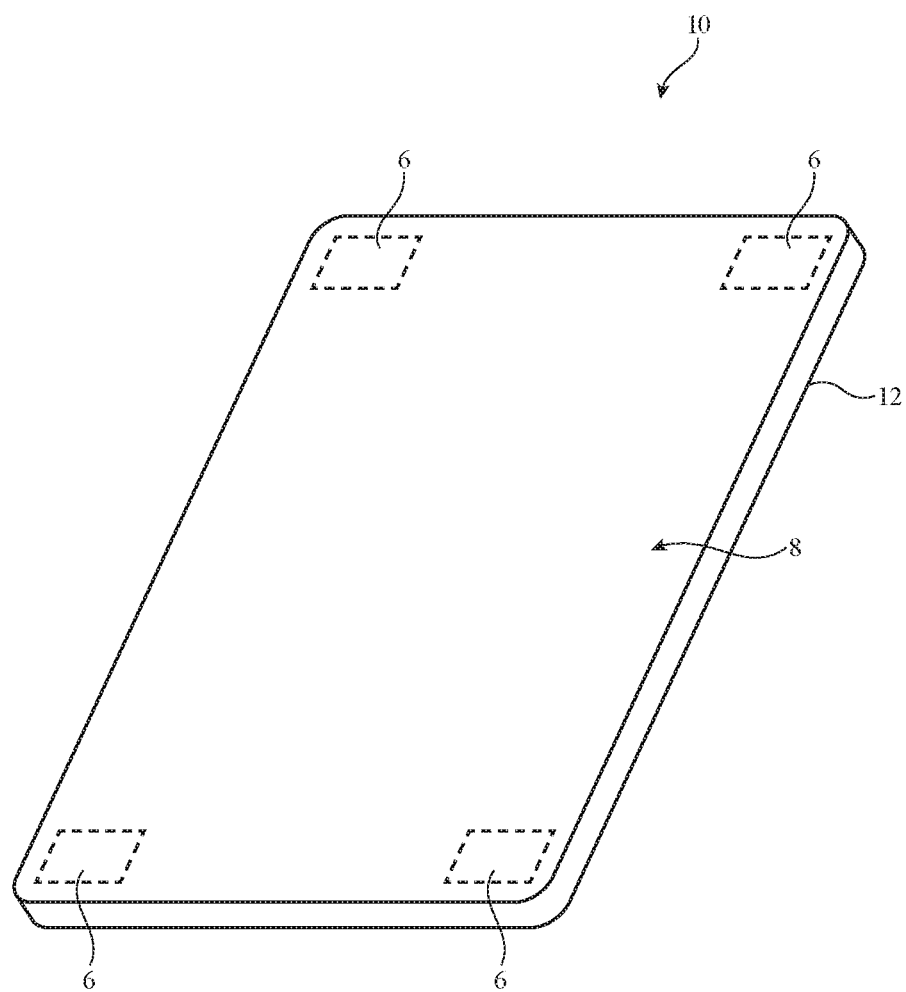
FIG. 1 is a perspective view of an illustrative electronic device with wireless circuitry in accordance with some embodiments.

An electronic device such as electronic device 10 of FIG. 1 may contain wireless circuitry. The wireless circuitry may include one or more antennas. The antennas may include phased antenna arrays that are used for performing wireless communications and/or spatial ranging operations using millimeter and centimeter wave signals. Millimeter wave signals, which are sometimes referred to as extremely high frequency (EHF) signals, propagate at frequencies above about 30 GHz (e.g., at 60 GHz or other frequencies between about 30 GHz and 300 GHz). Centimeter wave signals propagate at frequencies between about 10 GHz and 30 GHz. If desired, device 10 may also contain antennas for handling satellite navigation system signals, cellular telephone signals, local wireless area network signals, near-field communications, light-based wireless communications, or other wireless communications.

Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a virtual or augmented reality headset device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless access point or base station, a desktop computer, a portable speaker, a keyboard, a gaming controller, a gaming system, a computer mouse, a mousepad, a trackpad or touchpad, equipment that implements the functionality of two or more of these devices, or other electronic equipment. In the illustrative configuration of FIG. 1, device 10 is a portable device such as a cellular telephone, media player, tablet computer, portable speaker, or other portable computing device. Other configurations may be used for device 10 if desired. The example of FIG. 1 is merely illustrative.

As shown in FIG. 1, device 10 may include a display such as display 8. Display 8 may be mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 8 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes may be formed from an array of indium tin oxide pads or other transparent conductive structures.

Display 8 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 8 may be protected using a display cover layer such as a layer of transparent glass, clear plastic, sapphire, or other transparent dielectric. Openings may be formed in the display cover layer. For example, openings may be formed in the display cover layer to accommodate one or more buttons, sensor circuitry such as a fingerprint sensor or light sensor, ports such as a speaker port or microphone port, etc. Openings may be formed in housing 12 to form communications ports (e.g., an audio jack port, a digital data port, charging port, etc.). Openings in housing 12 may also be formed for audio components such as a speaker and/or a microphone.

Antennas may be mounted in housing 12. If desired, some of the antennas (e.g., antenna arrays that implement beam steering, etc.) may be mounted under an inactive border region of display 8 (see, e.g., illustrative antenna locations 6 of FIG. 1). Display 8 may contain an active area with an array of pixels (e.g., a central rectangular portion). Inactive areas of display 8 are free of pixels and may form borders for the active area. If desired, antennas may also operate through dielectric-filled openings in the rear of housing 12 or elsewhere in device 10.

To avoid disrupting communications when an external object such as a human hand or other body part of a user blocks one or more antennas, antennas may be mounted at multiple locations in housing 12. Sensor data such as proximity sensor data, real-time antenna impedance measurements, signal quality measurements such as received signal strength information, and other data may be used in determining when one or more antennas is being adversely affected due to the orientation of housing 12, blockage by a user's hand or other external object, or other environmental factors. Device 10 can then switch one or more replacement antennas into use in place of the antennas that are being adversely affected.

Antennas may be mounted at the corners of housing 12 (e.g., in corner locations 6 of FIG. 1 and/or in corner locations on the rear of housing 12), along the peripheral edges of housing 12, on the rear of housing 12, under the display cover glass or other dielectric display cover layer that is used in covering and protecting display 8 on the front of device 10, under a dielectric window on a rear face of housing 12 or the edge of housing 12, or elsewhere in device 10.

Figure 2:
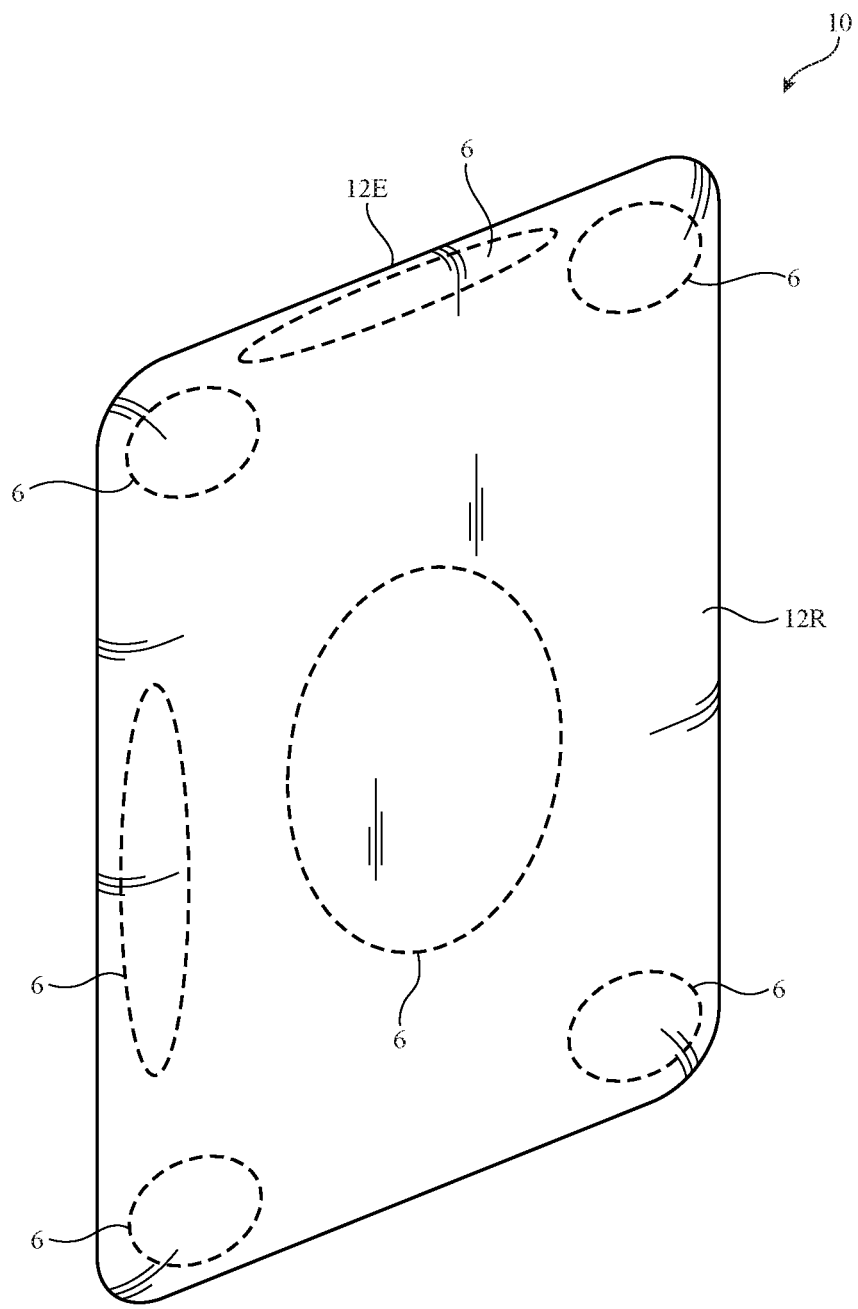
FIG. 2 is a rear perspective view of an illustrative electronic device with wireless circuitry in accordance with some embodiments.

FIG. 2 is a rear perspective view of electronic device 10 showing illustrative locations 6 on the rear and sides of housing 12 in which antennas (e.g., single antennas and/or phased antenna arrays) may be mounted in device 10. The antennas may be mounted at the corners of device 10, along the edges of housing 12 such as edges formed by sidewalls 12E, on upper and lower portions of rear housing wall 12R, in the center of rear housing wall 12R (e.g., under a dielectric window structure or other antenna window in the center of rear housing wall 12R), at the corners of rear housing wall 12R (e.g., on the upper left corner, upper right corner, lower left corner, and lower right corner of the rear of housing 12 and device 10), etc.

In configurations in which housing 12 is formed entirely or nearly entirely from a dielectric (e.g., plastic, glass, sapphire, ceramic, fabric, etc.), the antennas may transmit and receive antenna signals through any suitable portion of the dielectric. In configurations in which housing 12 is formed from a conductive material such as metal, regions of the housing such as slots or other openings in the metal may be filled with plastic or other dielectric. The antennas may be mounted in alignment with the dielectric in the openings. These openings, which may sometimes be referred to as dielectric antenna windows, dielectric gaps, dielectric-filled openings, dielectric-filled slots, elongated dielectric opening regions, etc., may allow antenna signals to be transmitted to external wireless equipment from the antennas mounted within the interior of device 10 and may allow internal antennas to receive antenna signals from external wireless equipment. In another suitable arrangement, the antennas may be mounted on the exterior of conductive portions of housing 12.

FIGS. 1 and 2 are merely illustrative. In general, housing 12 may have any desired shape (e.g., a rectangular shape, a cylindrical shape, a spherical shape, combinations of these, etc.). Display 8 of FIG. 1 may be omitted if desired. Antennas may be located within housing 12, on housing 12, and/or external to housing 12.

Figure 3:
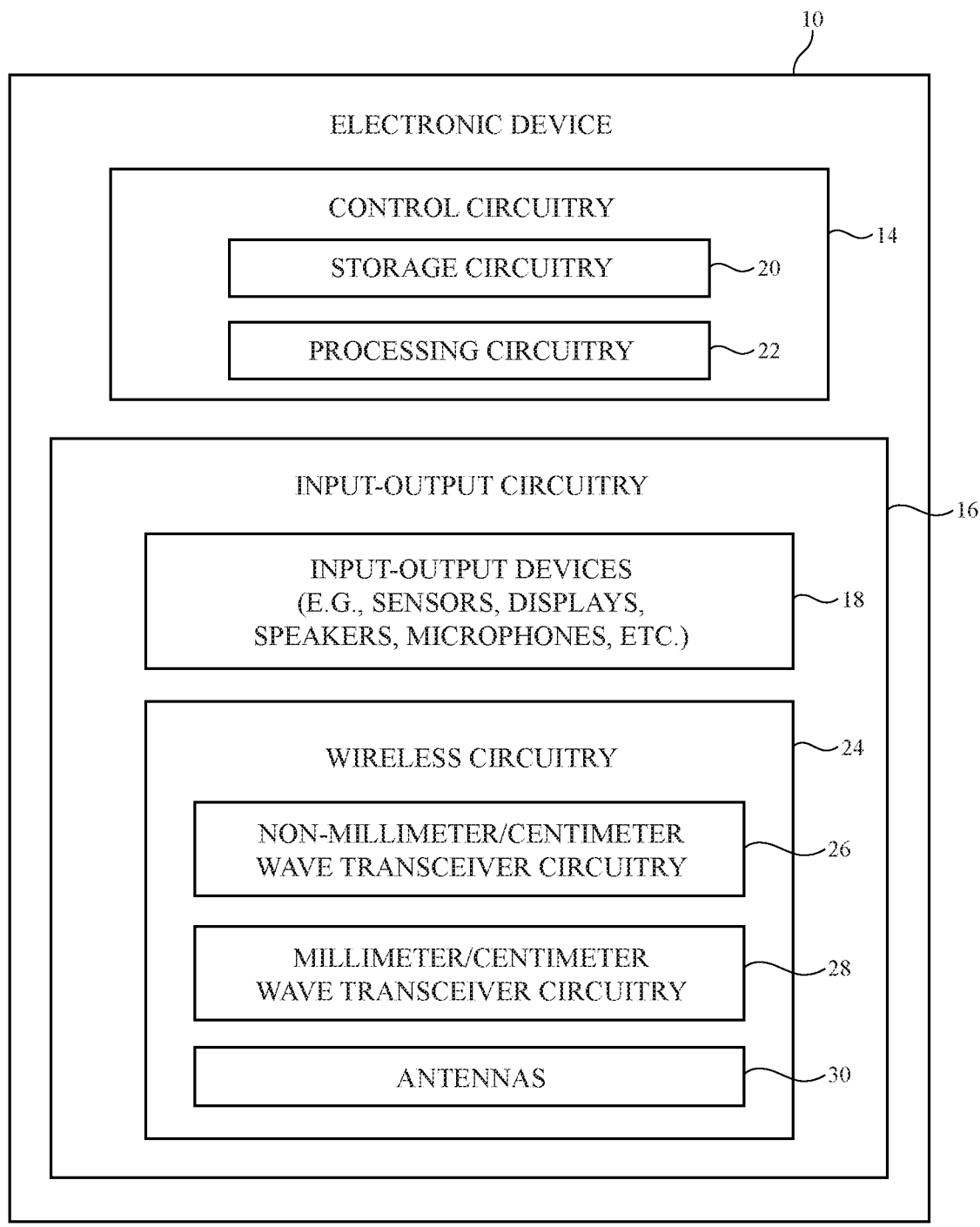
FIG. 3 is a schematic diagram of an illustrative electronic device with wireless circuitry in accordance with some embodiments.

A schematic diagram of illustrative components that may be used in device 10 is shown in FIG. 3. As shown in FIG. 3, device 10 may include control circuitry 14. Control circuitry 14 may include storage such as storage circuitry 20. Storage circuitry 20 may include hard disk drive storage, nonvolatile memory (e.g., flash memory or other electrically-programmable-read-only memory configured to form a solid-state drive), volatile memory (e.g., static or dynamic random-access-memory), etc. Control circuitry 14 may include processing circuitry such as processing circuitry 22. Processing circuitry 22 may be used to control the operation of device 10. Processing circuitry 22 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 20 (e.g., storage circuitry 20 may include non-transitory (tangible) computer readable storage media that stores the software code). The software code may sometimes be referred to as program instructions, software, data, instructions, or code. Software code stored on storage circuitry 20 may be executed by processing circuitry 22.

Control circuitry 14 may be used to run software on device 10 such as internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network protocols (e.g., IEEE 802.11 protocols—sometimes referred to as WiFi®), protocols for other short-range wireless communications links such as the Bluetooth® protocol or other WPAN protocols, IEEE 802.11ad protocols, cellular telephone protocols, MIMO protocols, antenna diversity protocols, satellite navigation system protocols, antenna-based spatial ranging protocols (e.g., radio detection and ranging (RADAR) protocols or other desired range detection protocols for signals conveyed at millimeter and centimeter wave frequencies), etc. Each communication protocol may be associated with a corresponding radio access technology (RAT) that specifies the physical connection methodology used in implementing the protocol.

Device 10 may include input-output circuitry 16. Input-output circuitry 16 may include input-output devices 18. Input-output devices 18 may be used to allow data to be supplied to device 10 and to allow data to be provided from device 10 to external devices. Input-output devices 18 may include user interface devices, data port devices, sensors, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, gyroscopes, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components.

Input-output circuitry 16 may include wireless circuitry such as wireless circuitry 24 for wirelessly conveying radio-frequency signals. While control circuitry 14 is shown separately from wireless circuitry 24 in the example of FIG. 3 for the sake of clarity, wireless circuitry 24 may include processing circuitry that forms a part of processing circuitry 22 and/or storage circuitry that forms a part of storage circuitry 20 of control circuitry 14 (e.g., portions of control circuitry 14 may be implemented on wireless circuitry 24). As an example, control circuitry 14 may include baseband processor circuitry or other control components that form a part of wireless circuitry 24.

Wireless circuitry 24 may include millimeter and centimeter wave transceiver circuitry such as millimeter/centimeter wave transceiver circuitry 28. Millimeter/centimeter wave transceiver circuitry 28 may support communications at frequencies between about 10 GHz and 300 GHz. For example, millimeter/centimeter wave transceiver circuitry 28 may support communications in Extremely High Frequency (EHF) or millimeter wave communications bands between about 30 GHz and 300 GHz and/or in centimeter wave communications bands between about 10 GHz and 30 GHz (sometimes referred to as Super High Frequency (SHF) bands). As examples, millimeter/centimeter wave transceiver circuitry 28 may support communications in an IEEE K communications band between about 18 GHz and 27 GHz, a $K_a$ communications band between about 26.5 GHz and 40 GHz, a $K_u$ communications band between about 12 GHz and 18 GHz, a V communications band between about 40 GHz and 75 GHz, a W communications band between about 75 GHz and 110 GHz, or any other desired frequency band between approximately 10 GHz and 300 GHz. If desired, millimeter/centimeter wave transceiver circuitry 28 may support IEEE 802.11ad communications at 60 GHz and/or $5^{th}$ generation mobile networks or $5^{th}$ generation wireless systems (5G) communications bands between 27 GHz and 90 GHz. Millimeter/centimeter wave transceiver circuitry 28 may be formed from one or more integrated circuits (e.g., multiple integrated circuits mounted on a common printed circuit in a system-in-package device, one or more integrated circuits mounted on different substrates, etc.).

Millimeter/centimeter wave transceiver circuitry 28 (sometimes referred to herein simply as transceiver circuitry 28 or millimeter/centimeter wave circuitry 28) may perform spatial ranging operations using radio-frequency signals at millimeter and/or centimeter wave frequencies that are transmitted and received by millimeter/centimeter wave transceiver circuitry 28. The received signals may be a version of the transmitted signals that have been reflected off of external objects and back towards device 10. Control circuitry 14 may process the transmitted and received signals to detect or estimate a range between device 10 and one or more external objects in the surroundings of device 10 (e.g., objects external to device 10 such as the body of a user or other persons, other devices, animals, furniture, walls, or other objects or obstacles in the vicinity of device 10). If desired, control circuitry 14 may also process the transmitted and received signals to identify a two or three-dimensional spatial location of the external objects relative to device 10.

Spatial ranging operations performed by millimeter/centimeter wave transceiver circuitry 28 are unidirectional. If desired, millimeter/centimeter wave transceiver circuitry 28 may also perform bidirectional communications with external wireless equipment. Bidirectional communications involve both the transmission of wireless data by millimeter/centimeter wave transceiver circuitry 28 and the reception of wireless data that has been transmitted by external wireless equipment. The wireless data may, for example, include data that has been encoded into corresponding data packets such as wireless data associated with a telephone call, streaming media content, internet browsing, wireless data associated with software applications running on device 10, email messages, etc.

If desired, wireless circuitry 24 may include transceiver circuitry for handling communications at frequencies below 10 GHz such as non-millimeter/centimeter wave transceiver circuitry 26. Non-millimeter/centimeter wave transceiver circuitry 26 may include wireless local area network (WLAN) transceiver circuitry that handles 2.4 GHz and 5 GHz bands for Wi-Fi® (IEEE 802.11) communications, wireless personal area network (WPAN) transceiver circuitry that handles the 2.4 GHz Bluetooth® communications band, cellular telephone transceiver circuitry that handles cellular telephone communications bands from 700 to 960 MHz, 1710 to 2170 MHz, 2300 to 2700 MHz, and/or or any other desired cellular telephone communications bands between 600 MHz and 4000 MHz, GPS receiver circuitry that receives GPS signals at 1575 MHz or signals for handling other satellite positioning data (e.g., GLONASS signals at 1609 MHz), television receiver circuitry, AM/FM radio receiver circuitry, paging system transceiver circuitry, near field communications (NFC) circuitry, etc. Non-millimeter/centimeter wave transceiver circuitry 26 and millimeter/centimeter wave transceiver circuitry 28 may each include one or more integrated circuits, power amplifier circuitry, low-noise input amplifiers, passive radio-frequency components, switching circuitry, transmission line structures, and other circuitry for handling radio-frequency signals.

Wireless circuitry 24 may include antennas 30. Non-millimeter/centimeter wave transceiver circuitry 26 may transmit and receive radio-frequency signals below 10 GHz using one or more antennas 30. Millimeter/centimeter wave transceiver circuitry 28 may transmit and receive radio-frequency signals above 10 GHz (e.g., at millimeter wave and/or centimeter wave frequencies) using antennas 30.

In satellite navigation system links, cellular telephone links, and other long-range links, radio-frequency signals are typically used to convey data over thousands of feet or miles. In Wi-Fi® and Bluetooth® links at 2.4 and 5 GHz and other short-range wireless links, radio-frequency signals are typically used to convey data over tens or hundreds of feet. Millimeter/centimeter wave transceiver circuitry 28 may convey radio-frequency signals over short distances that travel over a line-of-sight path. To enhance signal reception for millimeter and centimeter wave communications, phased antenna arrays and beam steering techniques may be used (e.g., schemes in which antenna signal phase and/or magnitude for each antenna in an array are adjusted to perform beam steering). Antenna diversity schemes may also be used to ensure that the antennas that have become blocked or that are otherwise degraded due to the operating environment of device 10 can be switched out of use and higher-performing antennas used in their place.

Antennas 30 in wireless circuitry 24 may be formed using any suitable antenna types. For example, antennas 30 may include antennas with resonating elements that are formed from stacked patch antenna structures, loop antenna structures, patch antenna structures, inverted-F antenna structures, slot antenna structures, planar inverted-F antenna structures, monopole antenna structures, dipole antenna structures, helical antenna structures, Yagi (Yagi-Uda) antenna structures, hybrids of these designs, etc. If desired, one or more of antennas 30 may be cavity-backed antennas. Different types of antennas may be used for different bands and combinations of bands. For example, one type of antenna may be used in forming a non-millimeter/centimeter wave wireless link for non-millimeter/centimeter wave transceiver circuitry 26 and another type of antenna may be used in conveying radio-frequency signals at millimeter and/or centimeter wave frequencies for millimeter/centimeter wave transceiver circuitry 28. Antennas 30 that are used to convey radio-frequency signals at millimeter and centimeter wave frequencies may be arranged in one or more phased antenna arrays.

Figure 4:
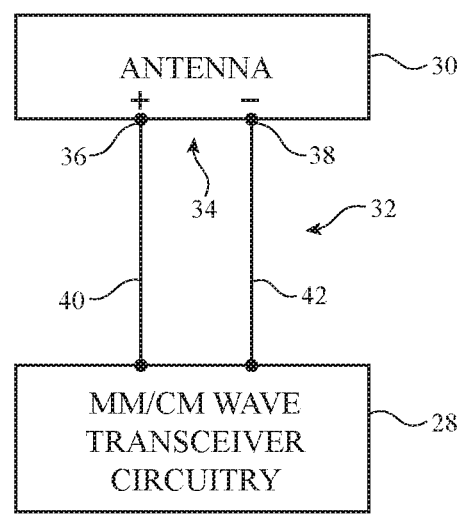
FIG. 4 is a schematic diagram showing how illustrative millimeter and centimeter wave transceiver circuitry may be coupled to an antenna using a radio-frequency transmission line path in accordance with some embodiments.

A schematic diagram of an antenna 30 that may be formed in a phased antenna array for conveying radio-frequency signals at millimeter and centimeter wave frequencies is shown in FIG. 4. As shown in FIG. 4, antenna 30 may be coupled to millimeter/centimeter (MM/CM) wave transceiver circuitry 28. Millimeter/centimeter wave transceiver circuitry 28 may be coupled to antenna feed 34 of antenna 30 using radio-frequency transmission line path 32. Antenna feed 34 may include a positive antenna feed terminal such as positive antenna feed terminal 36 and may include a ground antenna feed terminal such as ground antenna feed terminal 38. Radio-frequency transmission line path 32 (sometimes referred to herein as transmission line path 32) may include a positive signal path such as signal path 40 that is coupled to positive antenna feed terminal 36. Radio-frequency transmission line path 32 may include a ground signal path such as ground path 42 that is coupled to ground antenna feed terminal 38.

Radio-frequency transmission line path 32 may include one or more (radio-frequency) transmission lines. Radio-frequency transmission line path 32 may also include one or more radio-frequency connectors that couple the transmission lines in radio-frequency transmission line path 32 together. Signal path 40 may include the signal conductor of each transmission line in radio-frequency transmission line path 32. Ground path 42 may include the ground conductor of each transmission line in radio-frequency transmission line path 32. The transmission lines used to form radio-frequency transmission line path 32 may include coaxial cables, coaxial probes realized by metalized vias, microstrip transmission lines, stripline transmission lines (sometimes referred to herein simply as striplines), edge-coupled microstrip transmission lines, edge-coupled striplines, waveguide structures, coplanar waveguide structures, grounded coplanar waveguide structures, combinations of these, etc.

Multiple types of transmission lines may be used to form radio-frequency transmission line path 32. In one suitable arrangement that is sometimes described herein as an example, radio-frequency transmission line path 32 may include a coaxial cable, a stripline, and a radio-frequency connector that couples the stripline to the coaxial cable. The coaxial cable, the stripline, and the radio-frequency connector may convey radio-frequency signals at millimeter and centimeter wave frequencies for millimeter/centimeter wave transceiver circuitry 28 and antenna 30. Filter circuitry, switching circuitry, impedance matching circuitry, phase shifter circuitry, amplifier circuitry, and/or other circuitry may be interposed on radio-frequency transmission line path 32 and/or coupled to antenna 30, if desired.

One or more of the transmission lines in radio-frequency transmission line path 32 may be integrated into ceramic substrates, rigid printed circuit boards, and/or flexible printed circuits. In another suitable arrangement, one or more of the transmission lines in device 10 may be integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Device 10 may contain multiple antennas 30. The antennas may be used together or one of the antennas may be switched into use while other antenna(s) are switched out of use. If desired, control circuitry 14 (FIG. 3) may be used to select an optimum antenna to use in device 10 in real time and/or to select an optimum setting for adjustable wireless circuitry associated with one or more antennas 30. Antenna adjustments may be made to tune the antennas to radiate in desired frequency ranges, to perform beam steering with a phased antenna array, and to otherwise optimize antenna performance. Sensors may be incorporated into antennas 30 to gather sensor data in real time that is used in adjusting antennas 30.

In some configurations, antennas 30 may be arranged in one or more antenna arrays (e.g., phased antenna arrays that implement beam steering functions). For example, the antennas that are used in handling millimeter and centimeter wave signals may be implemented as a phased antenna array. Control circuitry 14 (FIG. 3) may perform beam steering functions using the phased antenna array by adjusting the phase and magnitude provided to each antenna in the phased antenna array (e.g., so that signals for each antenna constructively and destructively interfere such that the phased antenna array transmits or receives radio-frequency signals with a peak gain in a desired direction). The radiating elements in a phased antenna array for supporting millimeter and centimeter wave communications may be patch antennas (e.g., stacked patch antennas), dipole antennas, dipole antennas with directors and reflectors in addition to dipole antenna resonating elements (sometimes referred to as Yagi antennas or beam antennas), or other suitable antenna elements.

Figure 5:
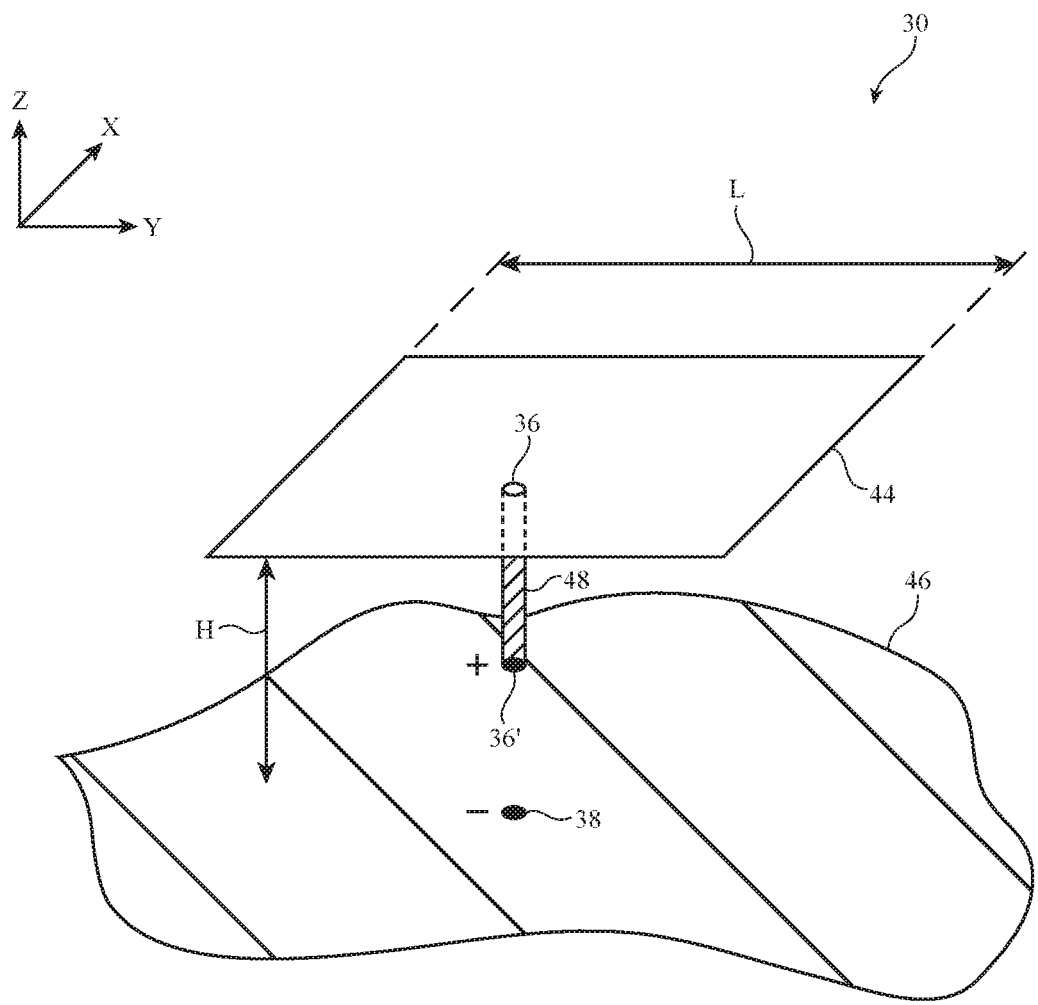
FIG. 5 is a perspective view of an illustrative patch antenna in accordance with some embodiments.

An illustrative patch antenna that may be used in conveying radio-frequency signals at frequencies between 10 GHz and 300 GHz is shown in FIG. 5. As shown in FIG. 5, antenna 30 may be a patch antenna having a patch antenna resonating element 44 that is separated from and parallel to a ground plane such as antenna ground 46. Positive antenna feed terminal 36 may be coupled to patch antenna resonating element 44. Ground antenna feed terminal 38 may be coupled to antenna ground 46. If desired, conductive path 48 (e.g., a coaxial probe feed) may be used to couple terminal 36' to terminal 36 so that antenna 30 is fed using a transmission line with a signal conductor coupled to terminal 36' and thus terminal 36. If desired, path 48 may be omitted and other types of antenna feed arrangements may be used. The illustrative feeding configuration of FIG. 5 is merely illustrative.

As shown in FIG. 5, patch antenna resonating element 44 may lie within a plane such as the X-Y plane of FIG. 5 (e.g., the lateral surface area of patch antenna resonating element 44 may lie in the X-Y plane). Patch antenna resonating element 44 may sometimes be referred to herein as patch 44, patch element 44, patch resonating element 44, patch radiating element 44, antenna resonating element 44, or resonating element 44. Antenna ground 46 may lie within a plane that is parallel to the plane of patch element 44. Patch element 44 and antenna ground 46 may therefore lie in separate parallel planes that are separated by a distance H. Patch element 44 and antenna ground 46 may be formed from conductive traces patterned on a dielectric substrate such as a rigid or flexible printed circuit board substrate or a ceramic substrate, metal foil, stamped sheet metal, electronic device housing structures, or any other desired conductive structures. The length of the sides of patch element 44 may be selected so that antenna 30 resonates at a desired operating frequency/wavelength. For example, the sides of patch element 44 may each have a length L that is approximately equal to half of the effective wavelength (e.g., within 15% of half of the effective wavelength) of the radio-frequency signals conveyed by antenna 30 (e.g., in scenarios where patch element 44 is substantially square). The effective wavelength of the radio-frequency signals is equal to the free-space wavelength of the radio-frequency signals multiplied by a constant factor that is determined by the dielectric material surrounding patch element 44.

The example of FIG. 5 is merely illustrative. Patch element 44 may have a square shape in which all of the sides of patch element 44 are the same length or may have a different rectangular shape (e.g., a non-square rectangular shape). Patch element 44 may cover multiple frequency bands in scenarios where patch element 44 has a rectangular shape. A parasitic patch antenna resonating element may be located above patch element 44 if desired. The parasitic patch antenna resonating element may serve to broaden the bandwidth of patch element 44, for example. If desired, patch element 44 and antenna ground 46 may have different shapes and orientations (e.g., planar shapes, curved patch shapes, patch shapes with non-rectangular outlines, shapes with straight edges such as squares, shapes with curved edges such as ovals and circles, shapes with combinations of curved and straight edges, etc.).

In the example of FIG. 5, antenna 30 is fed using a single positive antenna feed terminal 36. If desired, antenna 30 may be fed using multiple positive antenna feed terminals. Each positive antenna feed terminal may be fed using a different radio-frequency transmission line path and may cover a different orthogonal polarization, for example. Antenna 30 need not be a patch antenna and, in general, other types of antenna structures may be used to implement antenna 30.

Figure 6:
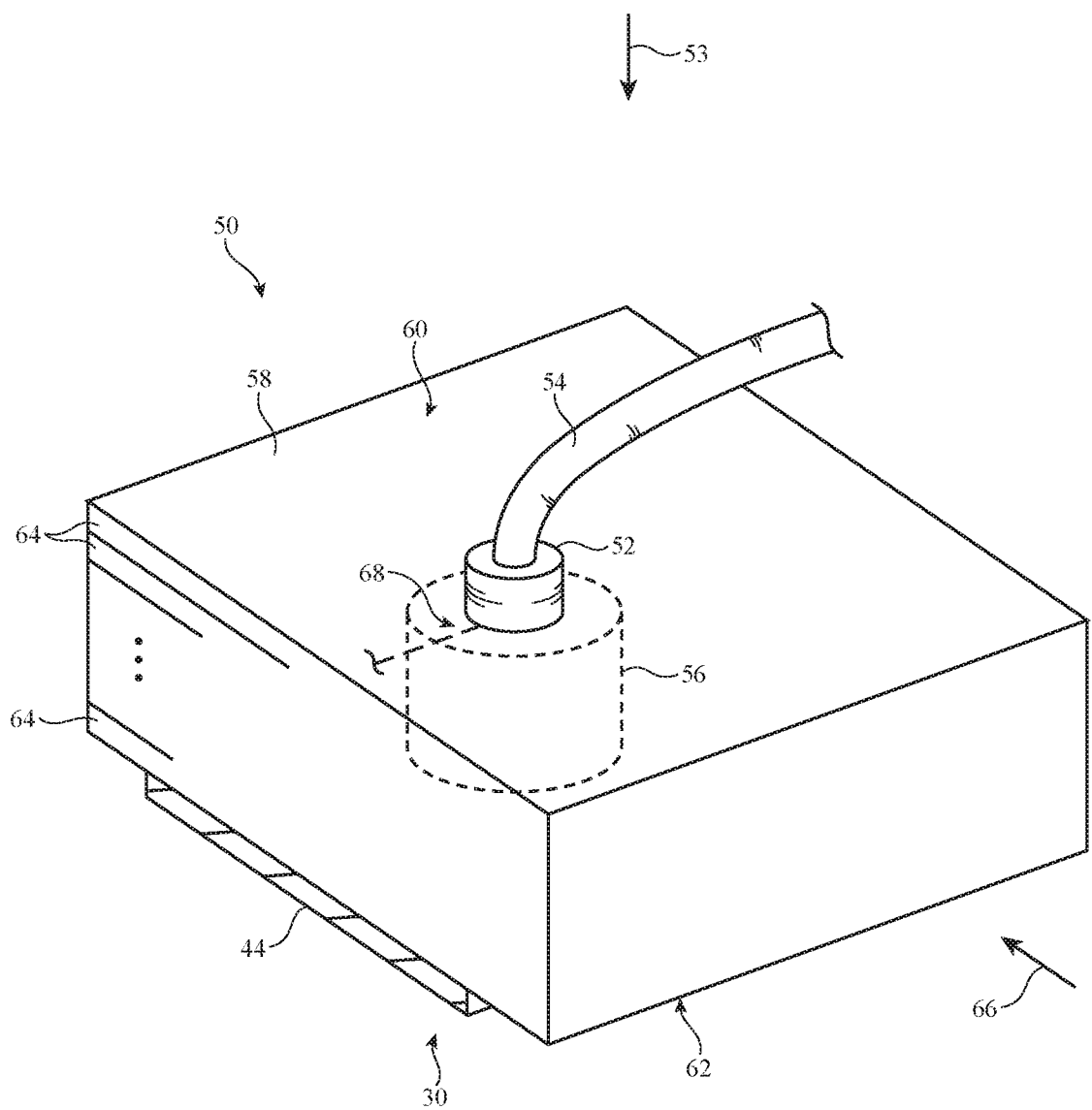
FIG. 6 is a perspective view of an illustrative antenna module having impedance matching structures for matching the impedance of a coaxial cable and connector to the impedance of a transmission line within the antenna module in accordance with some embodiments.

Multiple antennas 30 (e.g., multiple antennas in a given phased antenna array) may be mounted to the same substrate. Other circuitry such as a radio-frequency integrated circuit may also be mounted to the substrate to form an integrated antenna module. FIG. 6 is a perspective view of an integrated antenna module for handling signals between 10 and 300 GHz in device 10.

As shown in FIG. 6, device 10 may be provided with an integrated antenna module such as integrated antenna module 50 (sometimes referred to herein as antenna module 50 or module 50). Antenna module 50 may include one or more antennas 30 (e.g., antennas in a phased antenna array) on a dielectric substrate such as dielectric substrate 58. In the example of FIG. 6, a single patch element 44 of a corresponding antenna 30 is mounted to bottom surface 62 of dielectric substrate 58. This is merely illustrative. If desired, patch element 44 may be embedded within dielectric substrate 58, may be formed on top surface 60 of dielectric substrate 58, and/or may be replaced with other types of antenna resonating element structures. Antenna module 50 may include more than one antenna 30 if desired (e.g., an N-by-M array of antennas 30 arranged in a phased antenna array). Antenna module 50 may be mounted at any desired location within electronic device 10 of FIG. 1. In another suitable arrangement, antenna module 50 may be used in a wireless test system to test the radio-frequency performance of antenna 30 (e.g., antenna module 50 may be a test or validation coupon used to test and/or validate the radio-frequency performance of different designs or assemblies of antenna 30 and/or dielectric substrate 58).

Dielectric substrate 58 may be, for example, a rigid or flexible printed circuit board or another dielectric substrate such as a ceramic substrate. Dielectric substrate 58 may be a stacked dielectric substrate that includes multiple stacked dielectric layers 64 (e.g., multiple layers of printed circuit board substrate such as multiple layers of fiberglass-filled epoxy, rigid printed circuit board material, flexible printed circuit board material, ceramic, plastic, glass, or other dielectrics). Conductive traces formed on dielectric layers 64 may be used in implementing the antenna ground for antenna 30 (e.g., antenna ground 46 of FIG. 5), the antenna resonating element for antenna 30 (e.g., patch element 44), parts of the radio-frequency transmission line paths for antennas 30 (e.g., signal path 40 and/or ground path 42 in radio-frequency transmission line path 32 of FIG. 4), etc. Conductive vias may extend vertically through one or more dielectric layers 64 (e.g., in the direction of the Z-axis of FIG. 6) to couple conductive traces on different dielectric layers 64 together.

If desired, one or more electrical components may be mounted to top surface 60 of dielectric substrate 58 (not shown in FIG. 6 for the sake of clarity). These components may include, for example, an integrated circuit (e.g., an integrated circuit chip) or other circuitry mounted to top surface 60 of dielectric substrate 58. In another suitable arrangement, these components may be embedded within dielectric substrate 58 or formed on bottom surface 62 of dielectric substrate 58. These components may include radio-frequency components such as amplifier circuitry, phase shifter circuitry, and other circuitry that operates on the radio-frequency signals conveyed by antenna 30.

Antenna module 50 may convey radio-frequency signals to and from transceiver circuitry (e.g., millimeter/centimeter wave transceiver circuitry 28 of FIG. 3) over one or more radio-frequency transmission line paths (e.g., radio-frequency transmission line paths 32 of FIG. 4). Each radio-frequency transmission line path may include a first transmission line 68 embedded within dielectric substrate 58, a second transmission line 54 external to dielectric substrate 58, and a radio-frequency connector 52 that couples the first transmission line 68 to the second transmission line 54 (e.g., first transmission line 68, radio-frequency connector 52, and second transmission line 54 may collectively form one radio-frequency transmission line path 32 of FIG. 4). Radio-frequency connector 52 may be mounted to top surface 60 of dielectric substrate 58. While only a single radio-frequency connector and transmission line path is shown in FIG. 6 for the sake of clarity, in general, antenna module 50 may include any desired number of transmission line paths and radio-frequency connectors.

First transmission line 68 and second transmission line 54 may include any desired transmission line structures. In one suitable arrangement that is sometimes described herein as an example, first transmission line 68 is a stripline embedded in dielectric substrate 58 and coupled to antenna 30, whereas second transmission line 54 is a coaxial cable coupled to the millimeter/centimeter wave transceiver circuitry. First transmission line 68 may therefore sometimes be referred to herein as stripline 68 and second transmission line 54 may sometimes be referred to herein as coaxial cable 54.

In general, coaxial cable 54 and radio-frequency connector 52 exhibit a first impedance at the frequency of operation of antenna module 50 whereas stripline 68 exhibits a second impedance at the frequency of operation. If care is not taken, impedance mismatches at the transition (interface) between coaxial cable 54 and stripline 68 can produce undesirable signal reflections that serve to minimize the overall antenna efficiency for antenna 30. In some scenarios, impedance matching circuitry such as quarter wave transformers are mounted to dielectric substrate 58 and coupled to radio-frequency connector 52 to help match the impedance of coaxial cable 54 to the impedance of stripline 68. However, in practice, quarter wave transformers can occupy an excessive amount of space on antenna module 50, where space is often at a premium. In order to minimize space consumption on antenna module 50, antenna module 50 may include millimeter and centimeter wave impedance matching structures 56 embedded within substrate 58. Impedance matching structures 56 may include conductive traces and conductive vias embedded in dielectric substrate 58. The conductive traces and conductive vias may define a volume of dielectric substrate 58 that is configured to match the impedance of coaxial cable 54 to the impedance of stripline 68 (e.g., impedance matching structures 56 may be configured to match the impedance of coaxial cable 54 to the impedance of stripline 68 without the need for additional discrete components such as quarter wave transformers).

Figure 7:
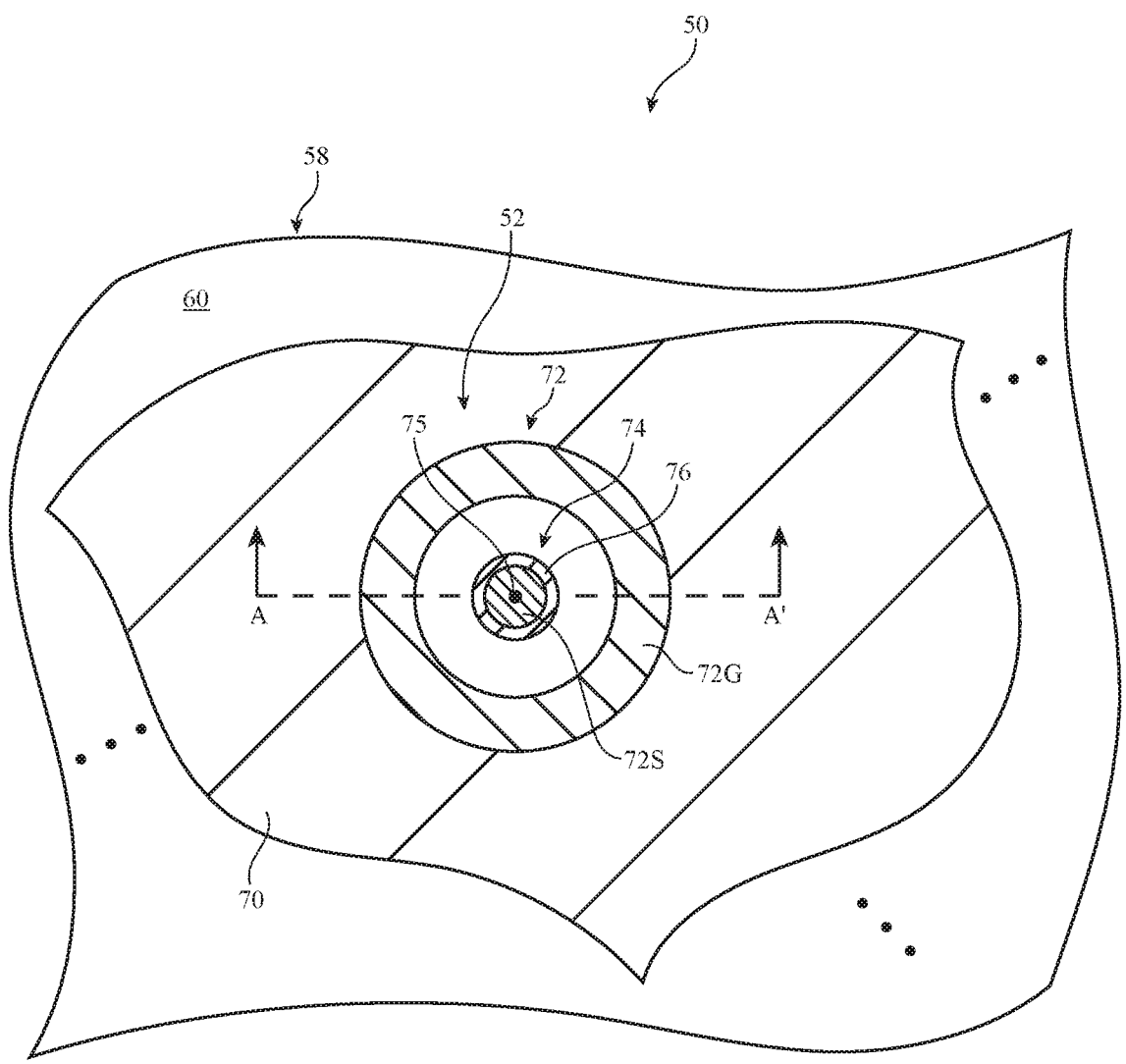
FIG. 7 is a top view of an illustrative radio-frequency connector mounted to ground traces at a surface of an antenna module in accordance with some embodiments.

FIG. 7 is a top-down view of a given radio-frequency connector 52 on antenna module 50 (e.g., as viewed in the direction of arrow 53 of FIG. 6). In the example of FIG. 7, coaxial cable 54 of FIG. 6 has been removed from radio-frequency connector 52 and the stripline embedded in antenna module 50 is not shown for the sake of clarity.

As shown in FIG. 7, radio-frequency connector 52 may be mounted to conductive traces 70 on top surface 60 of dielectric substrate 58. Conductive traces 70 may be held at a ground potential and may therefore sometimes be referred to herein as ground traces 70. Ground traces 70 may form part of the antenna ground for the antennas in antenna module 50 (e.g., ground traces 70 may form a part of antenna ground 46 of FIG. 5). Radio-frequency connector 52 may have a conductive body (housing) 72. Conductive body 72 may include an outer portion 72G and an inner portion 72S that is laterally surrounded by outer portion 72G. Conductive body 72 extends upwards from ground traces 70 and away from dielectric substrate 58 (e.g., in the −Z direction of FIG. 7). Conductive body 72 may exhibit rotational symmetry about central axis 75.

Outer portion 72G of conductive body 72 may be electrically and mechanically coupled to ground traces 70 using solder or other conductive interconnect structures (e.g., conductive adhesive, welds, etc.). This may serve to ground outer portion 72G to the antenna ground for antenna module 50. Outer portion 72G may therefore sometimes be referred to herein as the grounded body portion 72G of radio-frequency connector 52. Conductive body 72 may have a cavity such as cavity 74 that extends from the top surface of radio-frequency connector 52 downwards towards dielectric substrate 58 (e.g., in +Z direction of FIG. 7). Cavity 74 may overlap with an opening in ground traces 70. A contact pad 76 may be formed from a conductive trace on surface 60 within the opening in ground traces 70. Contact pad 76 may be coupled to the signal conductor of the stripline within antenna module 50 by conductive through vias extending vertically through dielectric substrate 58 (not shown in FIG. 7 for the sake of clarity). Inner portion 72S of conductive body 72 may be electrically and mechanically coupled to contact pad 76 (e.g., using solder, welds, conductive adhesive, etc.).

Cavity 74 may receive a coaxial cable (e.g., coaxial cable 54 of FIG. 6). When the coaxial cable is mounted to radio-frequency connector 52, the signal conductor for the coaxial cable may pass through cavity 74 and may contact inner portion 72S of conductive body 72. Inner portion 72S of conductive body 72 may therefore sometimes be referred to herein as the signal body portion 72S of radio-frequency connector 52. The ground conductor of the coaxial cable may be coupled to grounded body portion 72G of radio-frequency connector 52. If desired, grounded body portion 72G may include screw threads or other fastening structures that help to secure the coaxial cable to radio-frequency connector 52. Impedance matching structures within antenna module 50 (e.g., impedance matching structures 56 of FIG. 6) may be used to match the impedance of the coaxial cable and radio-frequency connector 52 to the impedance of the stripline embedded within antenna module 50.

Figure 8:
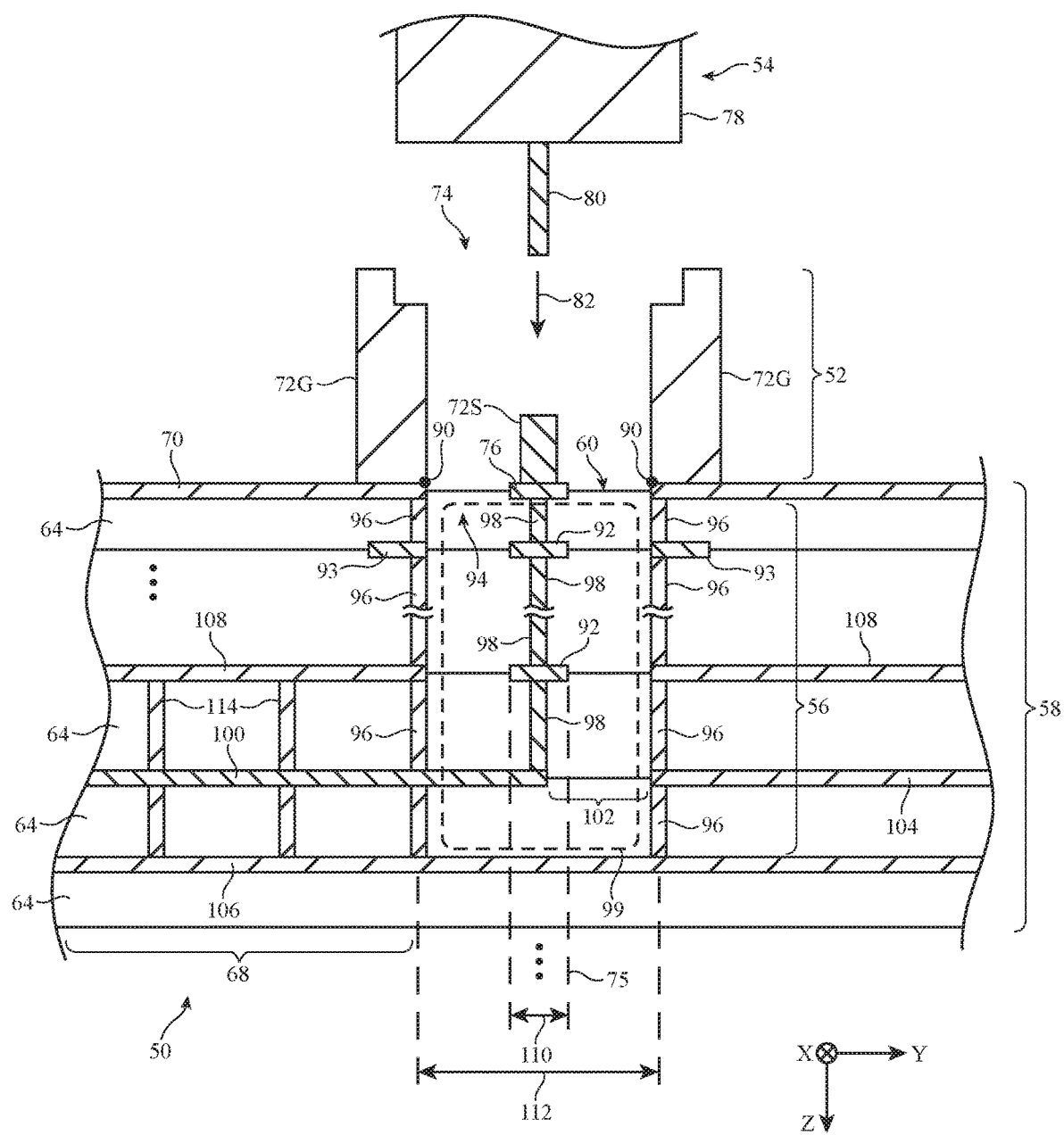
FIGS. 8 and 9 are cross-sectional side views of illustrative antenna modules having impedance matching structures for matching the impedance of a coaxial cable and connector to the impedance of a stripline within the antenna module in accordance with some embodiments.

FIG. 8 is a cross-sectional side view of the impedance matching structures within antenna module 50 (e.g., as taken along line AA' of FIG. 7 and viewed in the direction of arrow 66 of FIG. 6). As shown in FIG. 8, grounded body portion 72G of radio-frequency connector 52 laterally surrounds signal body portion 72S of radio-frequency connector 52. Signal body portion 72S and grounded body portion 72G may each be formed from a conductive material such as metal. Ground traces 70 may define opening 94. Contact pad 76 may be formed on surface 60 of dielectric substrate 58 within opening 94. Signal body portion 72S may be coupled to contact pad 76. Grounded body portion 72G may be coupled to ground traces 70 using solder 90 (e.g., the inner edges of grounded body portion 72G may be soldered to ground traces 70 using solder 90). In this way, grounded body portion 72G may be held at a ground potential.

Dielectric substrate 58 may include multiple stacked dielectric layers 64. Conductive traces 106 may be formed on a first (e.g., lower-most) dielectric layer 64. Conductive traces 100 and 104 may be formed on a second dielectric layer 64. Conductive traces 108 may be formed on a third dielectric layer 64. Conductive traces 108, 106, and 104 may each be held at a ground potential (e.g., may form part of antenna ground 46 of FIG. 5) and may therefore sometimes be referred to herein as embedded (internal) ground traces or simply as ground traces. Ground traces 70 and contact pad 76 may be formed on a fourth (e.g., upper-most) dielectric layer 64. The second dielectric layer 64 may be interposed between the first and third dielectric layers 64. The third dielectric layer 64 may be interposed between the second and fourth dielectric layers 64. One or more than one dielectric layer 64 may separate conductive traces 100 and ground traces 104 from ground traces 106. One or more dielectric layers 64 may separate conductive traces 100 and ground traces 104 from ground traces 108. One or more dielectric layers 64 may separate ground traces 108 from ground traces 70. More than one dielectric layer 64 may be layered under ground traces 106 if desired. The example of FIG. 8 is merely illustrative.

Conductive vias 114 may extend vertically through dielectric substrate 58 to couple ground traces 106 to ground traces 108 (e.g., without shorting to conductive traces 100). Conductive vias 96 may extend vertically through dielectric substrate 58 to couple ground traces 70 to ground traces 108 and to couple ground traces 108 to ground traces 106. Conductive vias 96 may also couple ground traces 104 to ground traces 108 and/or ground traces 106. Landing pads such as landing pads 93 may be provided to support conductive vias 96 on dielectric layers 64. If desired, other conductive vias may also be used to couple ground traces 108 and/or ground traces 106 to ground traces 104 (not shown in FIG. 8 for the sake of clarity). Similarly, if desired, additional conductive vias may be used to couple ground traces 70 to ground traces 108 (not shown in FIG. 8 for the sake of clarity).

Conductive via 98 may extend vertically through dielectric substrate 58 to couple contact pad 76 to conductive traces 100. Conductive landing pads such as landing pads 92 may be provided to support conductive via 98 at the interfaces between dielectric layers 64 from contact pad 76 to conductive traces 100 (e.g., conductive via 98 may be coupled to landing pads 92 at the surface of each dielectric layer 64 between conductive traces 100 and contact pad 76).

Stripline 68 may be formed from conductive traces 100 and ground traces 108 and 106. Conductive traces 100 may form the signal conductor for stripline 68 (e.g., part of signal path 40 for radio-frequency transmission line path 32 of FIG. 4). Conductive traces 100 may therefore sometimes be referred to herein as signal traces 100. The portion of ground traces 108 and 106 overlapping signal traces 100 may form the ground conductor for stripline 68 (e.g., part of ground path 42 for radio-frequency transmission line path 32 of FIG. 4). Stripline 68 may extend from conductive via 98 to a corresponding antenna on antenna module 50 (e.g., antenna 30 of FIG. 6).

Coaxial cable 54 may be inserted into cavity 74 of radio-frequency connector 52, as shown by arrow 82, until inner signal conductor 80 is placed in contact with signal body portion 72S and outer ground conductor 78 is placed in contact with grounded body portion 72G of radio-frequency connector 52. This may serve to ground outer ground conductor 78 of coaxial cable 54 to ground traces 70, 108, and 106 through grounded body portion 72G of radio-frequency connector 52. At the same time, inner signal conductor 80 is electrically coupled to stripline 68 through signal body portion 72S, contact pad 76, conductive via 98, and landing pads 92. In other words, signal traces 100, conductive via 98, landing pads 92, signal body portion 72S of radio-frequency connector 52, and inner signal conductor 80 of coaxial cable 54 may each form part of signal path 40 for radio-frequency transmission line path 32 of FIG. 4. Similarly, outer ground conductor 78, grounded body portion 72G, conductive vias 96, landing pads 93, conductive vias 114, ground traces 108, and ground traces 106 may each form part of ground path 42 for radio-frequency transmission line path 32 of FIG. 4. Radio-frequency signals may subsequently be conveyed over coaxial cable 54, radio-frequency connector 52, conductive vias 98 and 96, and stripline 68.

As shown in FIG. 8, impedance matching structures 56 may be embedded within dielectric substrate 58. Impedance matching structures 56 may include landing pads 92, landing pads 93, conductive vias 96, contact pad 76, ground traces 106, and the volume (cavity) 99 between these components. Volume 99 may have dimensions defined by landing pads 92, landing pads 93, and conductive vias 96. For example, volume 99 may be defined by the width 110 of landing pads 92 and a diameter 112 between opposing conductive vias 96.

Impedance matching structures 56 may serve as an interface between stripline 68 and radio-frequency connector 52/coaxial cable 54. Impedance matching structures 56 may serve to match the impedance of coaxial cable 54 and radio-frequency connector 52 (e.g., 50 Ohms) to the impedance of stripline 68. For example, the dimensions of volume 99 (e.g., the ratio of diameter 112 to width 110) may be selected, for the dielectric constant $d_k$ of dielectric substrate 58 within volume 99, to match the impedance of stripline 68 to the impedance of radio-frequency connector 52 and coaxial cable 54 over the frequency band covered by antenna module 50. In other words, impedance matching structures 56 may insure that an impedance of 50 Ohms is maintained from coaxial cable 54, through radio-frequency connector 52, the transition between radio-frequency connector 52 and stripline 68, and stripline 68 over the frequency band covered by antenna module 50. This may serve to minimize reflection and loss of radio-frequency signals at the interface between stripline 68 and coaxial cable 54. When arranged in this way, impedance matching structures 56 may provide impedance matching over a relatively wide bandwidth (e.g., from 20 GHz to 50 GHz, from 10 GHz to 60 GHz, from 10 GHz to 70 GHz, etc.). By embedding impedance matching structures 56 within the stack-up of antenna module 50, bulky quarter wave transformers or other surface mounted impedance matching components may be omitted from antenna module 50.

Ground traces 104 may be separated from signal traces 100 by gap 102. If desired, ground traces 104 may laterally surround signal traces 100 (e.g., in the X-Y plane of FIG. 8). Ground traces 104 may serve to shield signal traces 100 from electromagnetic interference and may allow multiple striplines for different radio-frequency transmission line paths to be formed from signal traces on the same dielectric layer 64 with sufficient electromagnetic isolation between each of the radio-frequency transmission line paths.

If desired, outer ground conductor 78 of coaxial cable 54 may be secured to grounded body portion 72G of radio-frequency connector 52 using conductive adhesive, solder, welds, screw threads on coaxial cable 54 and cavity 74, or using any other desired conductive interconnect structures. Similarly, if desired, inner signal conductor 80 may be soldered, welded, or adhered to signal body portion 72S of radio-frequency connector 52. This is merely illustrative. In one suitable arrangement, outer ground conductor 78 and cavity 74 both include screw threads that allow coaxial cable 54 to be screwed onto radio-frequency connector 52 and inner signal conductor 80 is placed into contact with signal body portion 72S without solder. This may allow coaxial cable 54 to be easily removed from radio-frequency connector 52 as needed.

Figure 9:
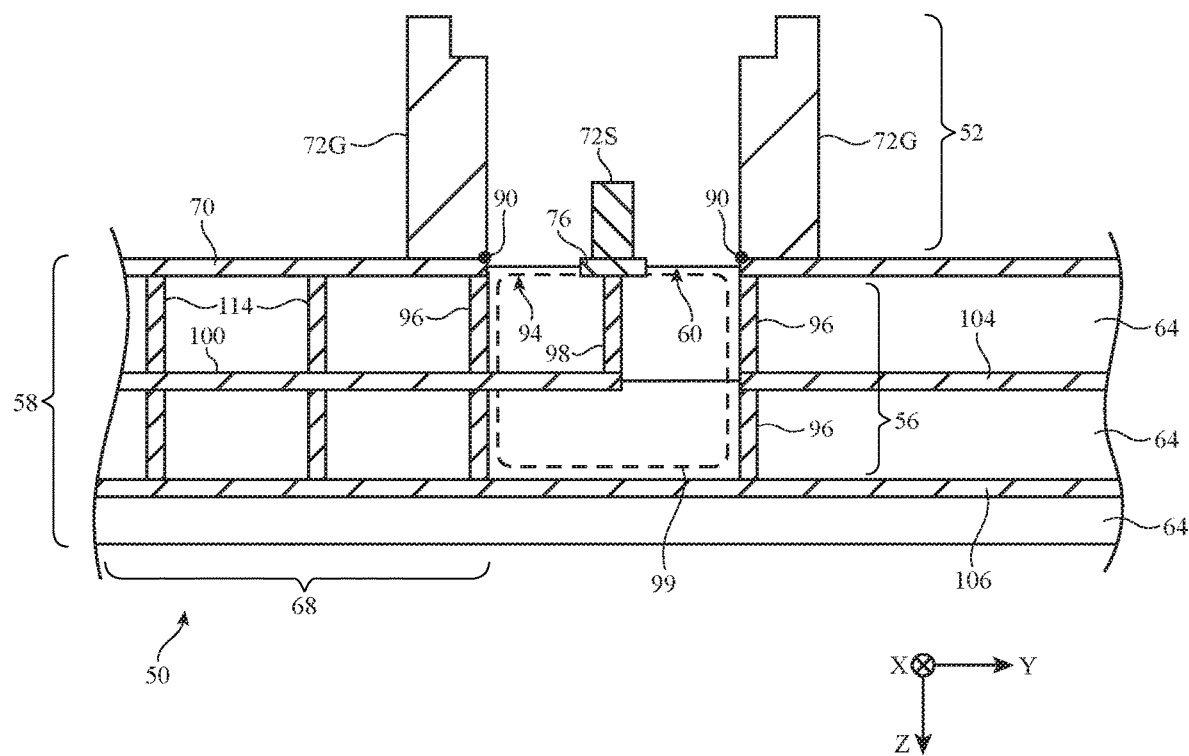

The example of FIG. 8 is merely illustrative. In another suitable arrangement, ground traces 108 may be omitted and ground traces 70 may be used to form part of the ground conductor for stripline 68. FIG. 9 is a cross-sectional side view of antenna module 50 in a scenario where ground traces 108 are omitted.

As shown in FIG. 9, ground traces 70 may form part of the ground conductor for stripline 68. Conductive vias 114 may couple ground traces 70 to ground traces 106. Volume 99 between conductive vias 96, contact pad 76, and ground traces 106 may configure impedance matching structures 56 to match the impedance of stripline 68 to the impedance of radio-frequency connector 52 and the coaxial cable over the frequency band of operation of antenna module 50. The example of FIG. 9 in which conductive via 98 extends through a single dielectric layer 64 is merely illustrative. If desired, conductive via 98 may extend through two or more dielectric layers 64 (e.g., two or more dielectric layers may be interposed between ground traces 70 and signal traces 100). Landing pads (e.g., landing pads 92 of FIG. 8) may be provided at the interface between each dielectric layer to support conductive via 98. The landing pads may help to define the dimensions of volume 99 to configure impedance matching structures 56 to match the impedance of stripline 68 to the impedance of radio-frequency connector 52 and the coaxial cable.

Figure 10:
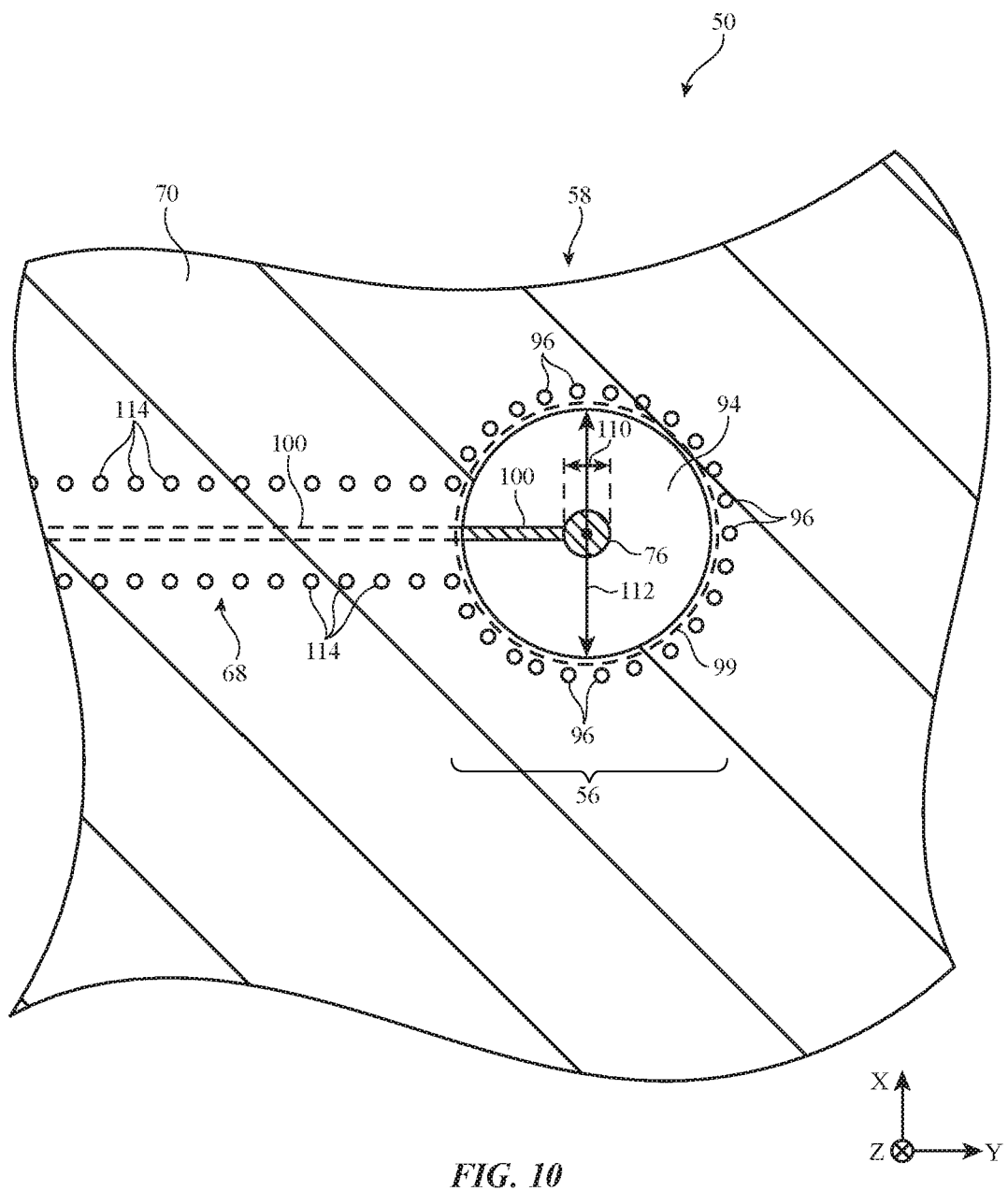
FIG. 10 is a top view of an illustrative antenna module having impedance matching structures for matching the impedance of a coaxial cable and connector to the impedance of a stripline within the antenna module in accordance with some embodiments.

FIG. 10 is a top-down view of opening 94 in ground traces 70 in the absence of radio-frequency connector 52. As shown in FIG. 10, contact pad 76 may be located within opening 94 in ground traces 70. The end of signal traces 100 overlap contact pad 76 (e.g., signal traces 100 are coupled to contact pad 76 by conductive via 98 of FIGS. 8 and 9). A ring-shaped fence of conductive vias 96 may extend from ground traces 70 to ground traces 106 (FIGS. 8 and 9) through dielectric substrate 58. The fence of conductive vias 96 may extend around opening 94 and may define the diameter 112 of volume 99 in impedance matching structures 56. The landing pads for conductive vias 96 (e.g., landing pads 93 of FIG. 8) may also help to define diameter 112. Contact pad 76 may have width 110 if desired. Width 110, diameter 112, and the dielectric constant of the material in dielectric substrate 58 within volume 99 may be selected to configure impedance matching structures 56 to match the impedance of stripline 68 to the impedance of the radio-frequency connector and the coaxial cable over the frequency band covered by antenna module 50.

Fences of conductive vias 114 may surround signal traces 100 in stripline 68. Stripline 68 may have a width (e.g., a width measured from one fence of conductive vias 114 on one side of signal traces 100 to the other fence of conductive vias 114 on the other side of signal traces 100) that is less than diameter 112.

Conductive vias 114 may be separated from one or more adjacent conductive vias 114 and conductive vias 96 may be separated from one or more adjacent conductive vias 96 by a distance that is sufficiently small so as to be opaque at the wavelengths of operation of antenna module 50. For example, conductive vias 114 may be separated from one or more adjacent conductive vias 114 and conductive vias 96 may be separated from one or more adjacent conductive vias 96 by less than one-sixth of the lowest effective wavelength of operation of antenna module 50, less than one-tenth the lowest effective wavelength, less than one-fifteenth the lowest effective wavelength, etc.

Figure 11:
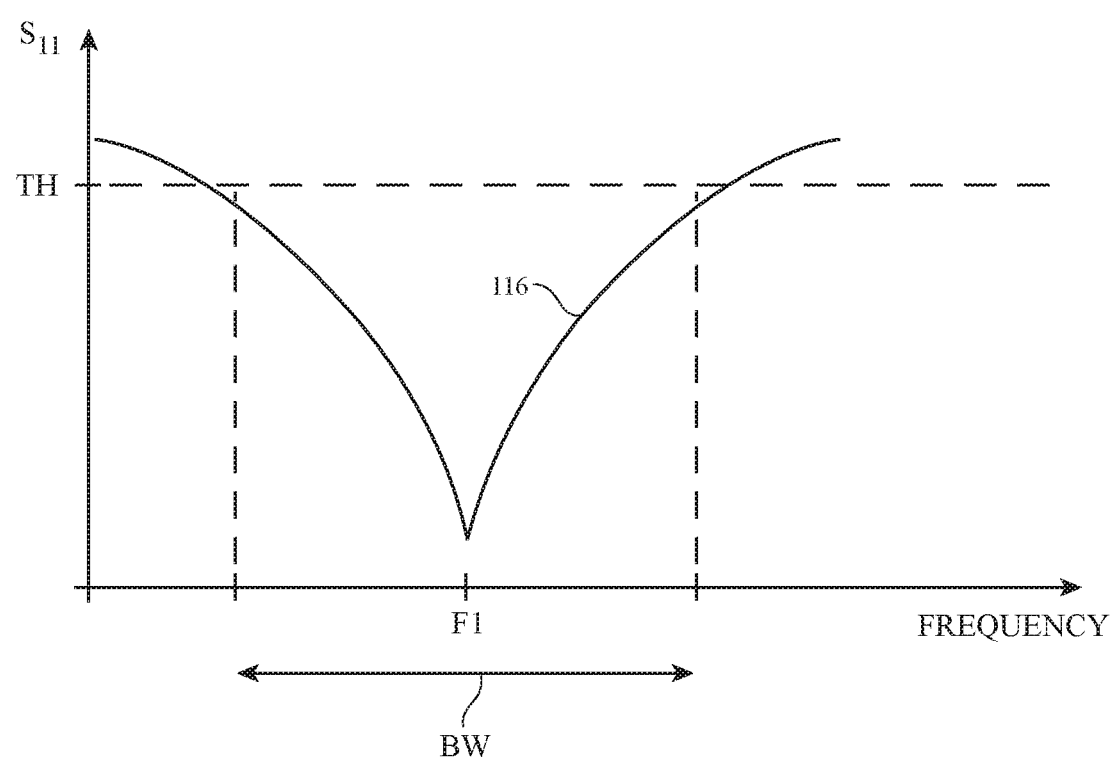
FIG. 11 is a plot of reflection coefficient as a function of frequency for impedance matching structures of the type shown in FIGS. 6-10 in accordance with some embodiments.

FIG. 11 is a plot illustrating the radio-frequency performance of impedance matching structures 56. As shown in FIG. 11, curve 116 plots the reflection coefficient $S_{11}$ of the radio-frequency transmission line path for antenna module 50 (e.g., radio-frequency transmission line path 32 of FIG. 4) at the interface between radio-frequency connector 52 and stripline 68 (e.g., at the location of impedance matching structures 56). As shown by curve 116, the radio-frequency transmission line path exhibits minimal signal reflection (and thus provides a maximum efficiency for the antenna coupled to the radio-frequency transmission line path) at frequency F1. The radio-frequency transmission line path may exhibit an acceptably low reflection coefficient (e.g., a reflection coefficient below threshold value TH) across a corresponding bandwidth BW. Impedance matching structures 56 (e.g., the dimensions of volume 99 and the material within volume 99) may be selected to align bandwidth BW with the frequency band of operation for antenna module 50. In this way, impedance matching structures 56 may ensure that minimal signal reflection occurs at the transition between coaxial cable 54 and stripline 68, thereby maximizing antenna efficiency for the antenna coupled to the stripline.

The example of FIGS. 8-10 is merely illustrative. Volume 99 may have any desired shape (e.g., shapes having curved and/or straight sides). Radio-frequency connector 52 may have any desired shape. Stripline 68 may be replaced with any desired type of transmission line such as a microstrip transmission line, an edge-coupled microstrip transmission line, an edge-coupled stripline transmission line, a waveguide structure, etc. Coaxial cable 54 may be replaced with any desired type of transmission line.

In the example of FIGS. 4-11, radio-frequency connector 52 and impedance matching structures 56 are used during operation of device 10 by an end user. In another suitable arrangement, radio-frequency connector 52 and impedance matching structures 56 may be used for performing radio-frequency testing of antenna 30 during design, manufacturing, and/or assembly of device 10. For example, antenna modules 50 may be assembled in a manufacturing system. Antenna modules 50 may be assembled to include an antenna 30 and impedance matching structures 56 in the manufacturing system. Radio-frequency connectors 52 may be mounted to antenna modules 50 in the manufacturing system. Coaxial cables (e.g., coaxial cables 54 of FIG. 6) may be coupled to the radio-frequency connectors. Radio-frequency test equipment may be coupled to the coaxial cables and may convey radio-frequency test signals over the antenna module (e.g., over the coaxial cables and the radio-frequency connectors). The test equipment may gather test data from the radio-frequency test signals to test the radio-frequency performance of the antennas in the antenna modules. If the test data indicates that the antennas exhibit satisfactory performance, the antennas may subsequently be assembled into electronic device 10 (FIG. 1) or may be used to assemble additional antenna modules (e.g., antenna modules having antennas of the same design). If the test data indicates that the antenna exhibits unsatisfactory performance, the antenna may be scrapped, reworked, or redesigned. Impedance matching structures 56 may ensure that minimal signal reflection occurs during this test and validation operation and to ensure that accurate test data is gathered, for example.

The foregoing is merely illustrative and various modifications can be made by those skilled in the art without departing from the scope and spirit of the described embodiments. The foregoing embodiments may be implemented individually or in any combination.

What is claimed is:

1. An antenna module configured to be coupled to a transceiver using a first transmission line, the antenna module comprising:
    a dielectric substrate;
    an antenna on the dielectric substrate and configured to convey radio-frequency signals at a frequency between 10 GHz and 300 GHz;
    a second transmission line embedded in the dielectric substrate;
    a radio-frequency connector mounted to the dielectric substrate, wherein the radio-frequency connector is configured to receive the first transmission line; and
    impedance matching structures that are embedded in the dielectric substrate and that couple the second transmission line to the radio-frequency connector, the impedance matching structures comprising a fence of conductive vias that is coupled to a grounded body portion of the radio-frequency connector, wherein the impedance matching structures are configured to match an impedance of the first transmission line to an impedance of the second transmission line.

2. The antenna module defined in claim 1, wherein the first transmission line comprises a coaxial cable.

3. The antenna module defined in claim 2, wherein the second transmission line comprises a stripline.

4. The antenna module defined in claim 1, wherein the second transmission line comprises a stripline.

5. The antenna module defined in claim 1, wherein the fence of conductive vias is ring-shaped, and a volume of the dielectric substrate has a diameter defined by the ring-shaped fence of conductive vias.

6. The antenna module defined in claim 5, further comprising a contact pad on a surface of the dielectric substrate, wherein the contact pad is coupled to a signal body portion of the radio-frequency connector.

7. The antenna module defined in claim 6, wherein the second transmission line comprises signal traces in the dielectric substrate, the antenna module further comprising:
    a conductive via that couples the signal traces to the contact pad.

8. The antenna module defined in claim 7, wherein the impedance matching structures further comprise landing pads coupled to the conductive via, wherein the landing pads define at least part of the volume.

9. The antenna module defined in claim 1, wherein the dielectric substrate comprises a first dielectric layer, a second dielectric layer, and a third dielectric layer, the second dielectric layer being interposed between the first and third dielectric layers, the antenna module further comprising:
    first ground traces on the first dielectric layer;
    signal traces on the second dielectric layer; and
    second ground traces on the third dielectric layer, wherein the signal traces and at least part of the first and second ground traces form the second transmission line.

10. The antenna module defined in claim 9, wherein the fence of conductive vias couple the first ground traces to the second ground traces and a volume of the first, second, and third dielectric layers is defined at least in part by the fence of conductive vias.

11. The antenna module defined in claim 10, wherein the radio-frequency connector is mounted to the second ground traces.

12. The antenna module defined in claim 10, further comprising:
    a fourth dielectric layer interposed between the radio-frequency connector and the second ground traces; and
    third ground traces on the fourth dielectric layer, wherein the fence of conductive vias is coupled to the third ground traces, the radio-frequency connector being mounted to the third ground traces.

13. Apparatus comprising:
    a dielectric substrate;
    an antenna on the dielectric substrate and configured to convey radio-frequency signals at a frequency between 10 GHz and 300 GHz;

a stripline having first ground traces, second ground traces, and signal traces, the signal traces being coupled to the antenna and extending between the first and second ground traces; and impedance matching structures embedded in the dielectric substrate and coupled to the stripline, wherein the impedance matching structures are configured to match an impedance of the stripline to an impedance of a transmission line external to the dielectric substrate.

14. The apparatus defined in claim 13, further comprising a contact pad at a surface of the dielectric substrate and a conductive via coupled to the contact pad and extending through the dielectric substrate, wherein the signal traces are coupled to the conductive via.

15. The apparatus defined in claim 14, further comprising:
a fence of conductive vias that couples the first ground traces to the second ground traces and that laterally surrounds the conductive via; and
a landing pad on the dielectric substrate and coupled to the conductive via at a location between the signal traces and the contact pad, wherein the impedance matching structures comprise the fence of conductive vias, the landing pad, and a volume of the dielectric substrate defined by the fence of conductive vias and the landing pad.

16. The apparatus defined in claim 15, wherein a dielectric constant of the dielectric substrate within the volume, a width of the landing pad, and a diameter of the fence of conductive vias are selected to configure the impedance matching structures to match the impedance of the stripline to the impedance of the transmission line external to the dielectric substrate.

17. The apparatus defined in claim 16, further comprising:
a radio-frequency connector mounted to the dielectric substrate and configured to receive the transmission line external to the dielectric substrate, wherein the transmission line external to the dielectric substrate comprises a coaxial cable, the radio-frequency connector comprising a signal body portion coupled to the contact pad and a grounded body portion coupled to the first ground traces by the fence of conductive vias.

18. Apparatus comprising:
a dielectric substrate;
ground traces on the dielectric substrate;
a radio-frequency connector on a surface of the dielectric substrate;
a coaxial cable coupled to the radio-frequency connector;
a stripline in the dielectric substrate;
a conductive via that couples a signal conductor of the stripline to the radio-frequency connector;
a landing pad in the dielectric substrate and coupled to the conductive via; and
a fence of conductive vias that couple the radio-frequency connector to the ground traces, wherein the fence of conductive vias runs around the conductive via and the landing pad, the landing pad and the fence of conductive vias defining a volume of the dielectric substrate that is configured to match an impedance of the stripline to an impedance of the coaxial cable.

19. The apparatus defined in claim 18, further comprising:
additional ground traces in the dielectric substrate, wherein the fence of conductive vias couples the ground traces to the additional ground traces, and the signal conductor of the stripline extends between the ground traces and the additional ground traces.

* * * * *